Jan. 30, 1968 J. J. McMANUS ET AL 3,366,914

SOLDERLESS CONNECTOR FOR PRINTED BOARD CIRCUITS

Filed May 18, 1965

JOHN J. McMANUS
RALPH ROSEN
INVENTORS.

BY R. Henderson
ATTORNEY

United States Patent Office
3,366,914
Patented Jan. 30, 1968

3,366,914

SOLDERLESS CONNECTOR FOR PRINTED BOARD CIRCUITS

John J. McManus, Valley Stream, and Ralph Rosen, New York, N.Y., assignors to The Western Union Telegraph Company, New York, N.Y., a corporation of New York Filed May 18, 1965, Ser. No. 456,711
4 Claims. (Cl. 339—17)

This invention relates to means for interconnecting electrical conductors of the kind associated with small components of electronic circuitry and more particularly to improved means for arranging and facilitating such interconnection of small multi-conductor components.

It will be recognized that the miniaturization of electronic components has resulted in the production of functional modules, whether in the form of flat packs or round modules, having either radial or axial leads. Since these modules comprise a number of circuit elements which are interconnected within the module, the entire module is provided with up to a dozen or more protruding wire leads.

It is evident that making the necessary electrical connections to these protruding leads in a manner which is both reliable and convenient is an increasingly difficult task as the size of the module is decreased. A module measuring one-eighth inch by one-quarter inch in outside dimensions and having ten protruding leads, for example, represents a connection problem which requires something more than the customary soldering iron for its solution.

By means of the present invention, such connections are made more rapid, more certain and equally easy to accomplish regardless of the large number of conductors which may be used. The module is removable and replaceable at will and without difficulty and by the means to be described connections are made which display a permanent low contact resistance and which remain substantially noise-free indefinitely.

It is therefore an object of the invention to provide means to make a rapid and effective connection to a multiconductor electronic module having radial leads.

It is a further object of the invention to provide such connecting means to such a module having axial leads.

It is still another object of the invention to provide such connecting means wherein the module is readily removable and replaceable at will.

Still another object of the invention is to provide such connecting means which requires no heating of the leads of the module in order to effect a permanent and low-resistance electrical connection thereto.

It is a still further object of the invention to provide such means for removably mounting a circuit module without the use of a socket or of any of the pin connectors thereof.

These objects are accomplished by means of a novel and improved connecting device as hereafter described and set forth in the attached drawings whereof:

Figure 1:
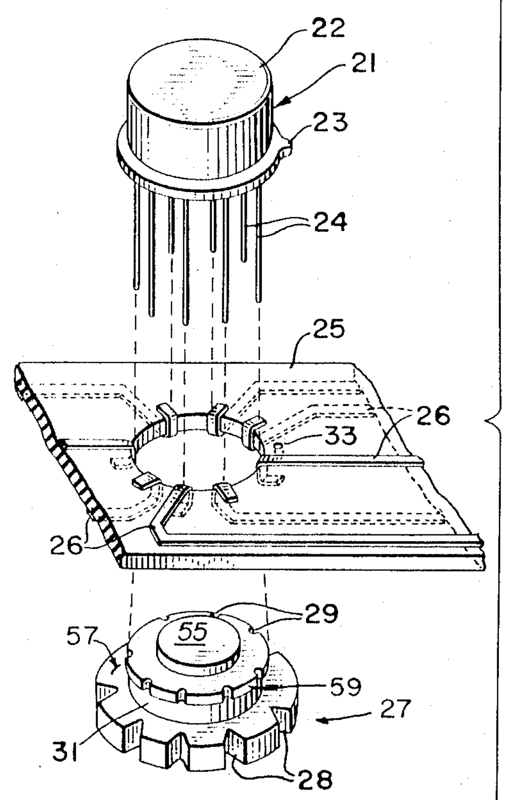
FIG. 1 is an exploded view of an axial module connector assembly constructed in accordance with the instant invention.

Turning now to the drawings, there is seen in FIG. 1 a circuit module 21 comprising an electronic microcircuit hermetically enclosed in a metal container 22 provided with an orientation lug 23 and a plurality of axial wire leads such as 24. The microcircuit is intended to be electrically connected into the electronic circuitry printed on the circuit board or substrate 25 in the form of plated or cemented electrical conductors 26 on the surface of either side thereof. The conductors 26 will be observed to continue through the aperture shown in the board 25 so as to provide integral portions of the conductors within the axial passage of the aperture.

A plug 27 made of elastomeric material in the form shown has a head 55 and a radially disposed interior plane surface comprising a collar 31 embodying a shoulder 57 with notches such as 28 for the reception but not the clearance of leads 24. Notches 29 on the other hand are provided for clearance around the leads. The notches or grooves 28 are vertically disposed about the periphery of the collar 31 and extend inwardly to a depth in the collar less than the entire depth of its shoulder 57.

Figure 2:
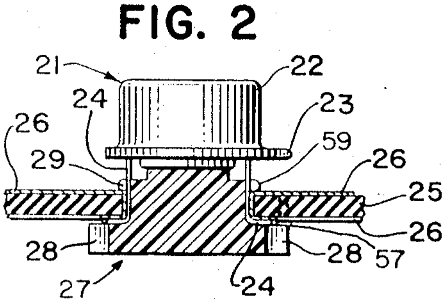
FIG. 2 is a cross-sectional view of the assembly of FIG. 1.

It has been found that when these components are assembled in the manner shown in FIG. 2, namely by inserting the leads 24 through the aperture in board 25, adjusting it to the correct orientation according to lug 23, straightening the leads 24 so that they will fall into appropriate ones of the notches 28, a pressure can be developed between the leads 24 and the conductors 26 which is sufficiently large and permanent to create an unvarying low resistance contact therebetween.

Upon pressing the plug 27 upwardly among the leads 24 and through the aperture in board 25 the leads 24 are bent at right angles as shown in FIG. 2 and may be clipped off as there shown. At the same time the plug 27 forces the leads 24 firmly against the conductors 26 on the sides of the aperture. A second collar 59 of the plug 27 then springs outward to draw the plug 27 firmly into the aperture and also to press the bent-over portions of leads 24 more tightly against the surface portions of conductors 26.

It will be observed that the lug 23 on the flange of the container 22 indicates the orientation of the leads 24 of the module 21 which is required in order to make connection in the proper sequence to the conductors 26 of the circuit board 25. This lug 23 may be lined up conveniently with a mark on the circuit board 25 or with a small hole such as 33 therein in order to ensure the proper connections being made.

Figure 3:
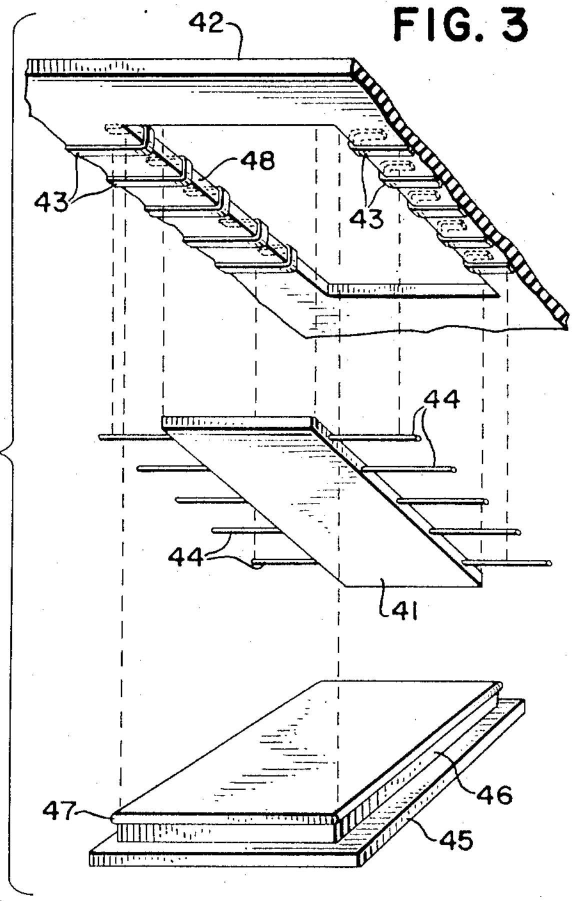
FIG. 3 is an exploded view of the invention as applied to a module having radial leads.

In FIG. 3 there is seen an exploded view of a "flat-pack" integrated circuit module 41 of the now conventional kind. A circuit board 42 of insulating material has electrical conductors such as 43 adhered to its surface for making independent connections to each of the wire leads such as 44 protruding from the opposite edges of the module 41. A headed plug of elastomeric, resilient plastic material 45 provided with a reduced or necked down portion 46 and a bead or flange portion 47 is constructed in such size as to fit tightly into the aperture 48 of the circuit board 42, and to be retained there, in the manner previously described. When the integrated circuit module 41 is placed in contact with the circuit board 42 having its electrical leads 44 properly in register with the adhesively secured conductors 43 of the board 42; and when the plug 45 is then pressed against it, and into and through the aperture 48, an assembly as depected in FIG. 4 is obtained after the excess length of conductors 44 is clipped off.

Figure 4:
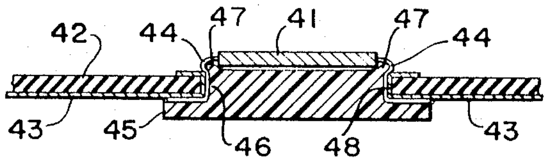
FIG. 4 is a cross-sectional view of the assembly of FIG. 3.

As will be seen in FIG. 4 the wire lead conductors 44 are thereby deformed to make contact with the adhesively retained conductors 43 both on the surface of the board 42 and on that portion of the conductors 43 lying within the aperture 43.

Figure 5:
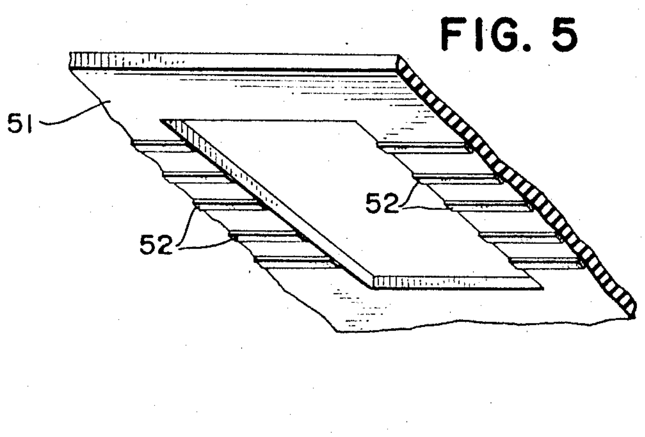
FIG. 5 is a view of an alternative means of constructing a portion of FIG. 3.

This form of the invention is desirable for the reason that connection is made to the conductors 43 both at the surface portion thereof and at the involuted portion of the conductors 43, as well as being made during and by means of a bending and pressure-dragging process applied to the leads 44 during high pressure contact with the conductors 43. The circuit board 51 shown in FIG. 5 has conductors 52 adhesively secured to its surface only. Adequate connection can be made to this form of board also, because of the bending and pressure dragging nature of the formation of the connections at the time of the insertion of plug 45 when the board 51 is substituted for the board 42 in the assembly of FIGS. 3 and 4. Because of the difficulty of production of the involuted portions of coductors 43, it will be advantageous to employ the construction of conductors 52 in cases of short-run production and in cases where the conductors 52 and 44 are adequately protected against corrosive deterioration of the contacting surfaces as by gold-plating or otherwise.

Although this invention has been described in terms of a preferred embodiment of a specific illustrative example thereof, it is not intended that the invention shall be limited thereto and the invention therefore is intended to be limited only by the appended claims.

What is claimed is:

1. In an electrical assembly comprising a device having a plurality of wires spaced on the periphery thereof for connection to correspondingly located conductors adhesively affixed on an insulative planar substrate having an aperture therein, said conductors being spaced about the periphery of the aperture, the combination comprising a plug of elastomeric insulative material having a necked down portion, a shoulder like collar larger than the aperature adjacent said necked down portion and a head on the plug at the opposite end to said shoulder, a plurality of grooves on the collar for receiving the wires on the plug extending a distance less than the distance to said necked down portion, the device over being received in the aperture with the wires in register with the conductors and the grooves on the collar, whereby the plug connects the wires to the conductors by a sustained pressure contact with said shoulders.

2. The electrical assembly claimed in claim 1 whereby said wires are connected at right angles to the conductors by the sustained pressure contact.

3. The electrical assembly claimed in claim 2 wherein the aperture in the insulative planar substrate is circular and the shoulder-like collar is circular.

4. The electrical assembly claimed in claim 2 wherein the grooves on the collar are axial about the periphery thereof.

References Cited

UNITED STATES PATENTS

| | | | |
|---|---|---|---|
| 3,263,200 | 7/1966 | Kocmich | 339—17 |
| 2,524,939 | 10/1950 | Stephan et al. | 174—138.5 |
| 2,881,405 | 4/1959 | Yarbrough | 174—138.5 |
| 2,904,617 | 9/1959 | King | 174—50.51 X |
| 3,184,699 | 5/1965 | Spera | 339—17 |
| 3,206,716 | 9/1965 | Spera | 339—17 X |

ROBERT K. SCHAEFER, *Primary Examiner.*

D. SMITH, W. C. GARVERT, *Assistant Examiners.*